(12) United States Patent
Sasaki

(10) Patent No.: US 8,310,068 B2
(45) Date of Patent: Nov. 13, 2012

(54) TCP-TYPE SEMICONDUCTOR DEVICE

(75) Inventor: Suguru Sasaki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 50 days.

(21) Appl. No.: 12/805,017

(22) Filed: Jul. 7, 2010

(65) Prior Publication Data
US 2011/0049688 A1 Mar. 3, 2011

(30) Foreign Application Priority Data
Aug. 26, 2009 (JP) .................................. 2009-195988

(51) Int. Cl.
H01L 23/08 (2006.01)
H01L 23/48 (2006.01)
H01L 31/26 (2006.01)
(52) U.S. Cl. ................. 257/786; 257/E23.179
(58) Field of Classification Search .......... 257/786, 257/E23.07, E23.179
See application file for complete search history.

(56) References Cited

U.S. PATENT DOCUMENTS

| 4,874,086 | A | 10/1989 | Imamura et al. | |
|---|---|---|---|---|
| 6,899,544 | B2 | 5/2005 | Tanokura et al. | |
| 7,414,323 | B2* | 8/2008 | Hirae | 257/786 |
| 7,728,421 | B2* | 6/2010 | Tanoue | 257/692 |
| 2004/0242027 | A1 | 12/2004 | Tanokura et al. | |
| 2007/0176300 | A1* | 8/2007 | Sota | 257/778 |

FOREIGN PATENT DOCUMENTS

| JP | 57-199228 A | 12/1982 |
|---|---|---|
| JP | 63-306633 A | 12/1988 |
| JP | 4-5643 A | 1/1992 |
| JP | 4-226045 A | 8/1992 |
| JP | 7-74210 A | 3/1995 |
| JP | 8-94668 A | 4/1996 |
| JP | 8-222299 A | 8/1996 |
| JP | 2004-356339 A | 12/2004 |
| JP | 2008-300297 A | 12/2008 |
| JP | 2010-50296 A | 3/2010 |

OTHER PUBLICATIONS

Notice of Reasons for Rejection dated Aug. 18, 2011, with English translation.

* cited by examiner

*Primary Examiner* — William D Coleman
(74) *Attorney, Agent, or Firm* — McGinn IP Law Group, PLLC

(57) ABSTRACT

A TCP type semiconductor device, which is connected to a plurality of substrate-side electrodes parallel to each other and each having a linear shape, has: a base film; a semiconductor chip mounted on the base film; and a plurality of leads formed on the base film and electrically connecting between the semiconductor chip and the plurality of substrate-side electrodes, respectively. Each of the plurality of leads has an external terminal section extending in a first direction and configured to come in contact with corresponding one of the plurality of substrate-side electrodes. A part of the external terminal section is a wide section that is formed wider than the other section of the external terminal section A position of the wide section in the first direction is different between adjacent leads of the plurality of leads.

18 Claims, 8 Drawing Sheets

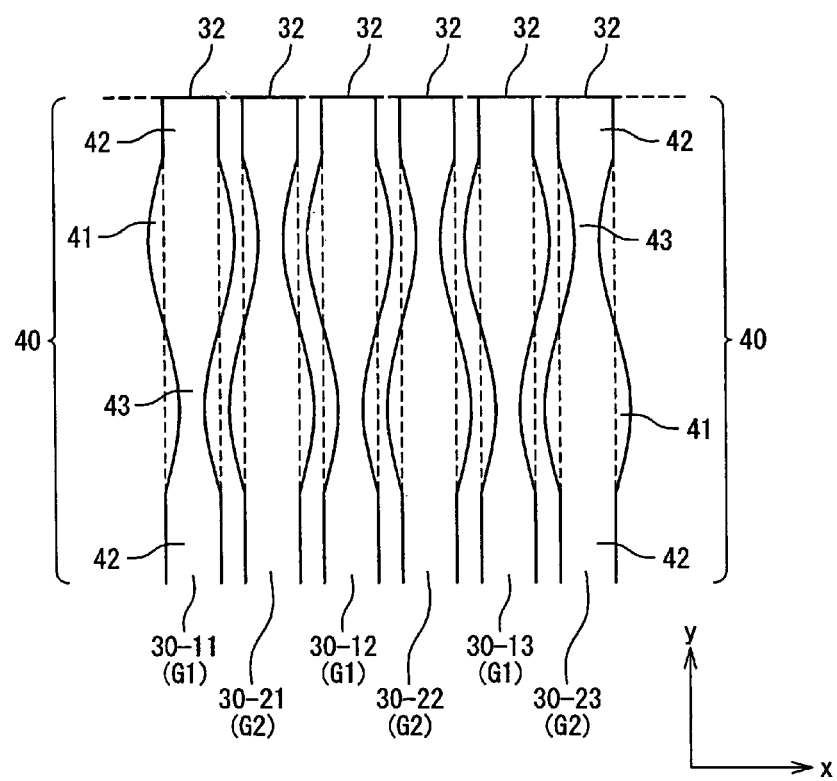

TCP-TYPE SEMICONDUCTOR DEVICE

INCORPORATION BY REFERENCE

This application is based upon and claims the benefit of priority from Japanese patent application No. 2009-195988, filed on Aug. 26, 2009, the disclosure of which is incorporated herein in its entirety by reference.

BACKGROUND OF THE INVENTION

1. Field of the Invention

The present invention relates to a semiconductor device and a method of testing thereof. In particular, the present invention relates to a TCP (Tape Carrier Package) type semiconductor device and a method of testing thereof.

2. Description of Related Art

A probe card used for testing a semiconductor device is publicly known. The probe card has a large number of probes that come in contact with test terminals of a test target. The test is performed by bringing respective ends of the probes into the corresponding test terminals, supplying a test signal from a tester to the test target through the probe card and retrieving an output signal from the test target. At this time, it is required to correctly bring each probe into one-on-one contact with the corresponding test terminal so as not to cause a short failure and the like.

Meanwhile, a pitch between adjacent test terminals is getting narrower due to recent miniaturization and increase in the number of terminals of the semiconductor device. Therefore, the probe card also needs to follow the narrowing of the test terminal pitch. For example, it may be considered to narrow a pitch between ends of adjacent probes of the probe card following the narrowing of the test terminal pitch. However, there is a limit to the narrowing of the pitch between the probe ends because electrical isolation must be ensured between the adjacent probes. Consequently, it is proposed to distribute positions of the probe ends over a plurality of rows. Due to this configuration, it is possible to narrow a substantive pitch between the probe ends while ensuring the electrical isolation between the probes, which enables following the narrowing of the test terminal pitch. Probe cards having such the probe pattern are disclosed, for example, in Japanese Patent Publication JP-H08-94668A, Japanese Patent Publication JP-H08-222299A and Japanese Utility Model Publication JP-H04-5643A.

Moreover, a TCP (Tape Carrier Package) type semiconductor device is publicly known. In the case of the TCP, a semiconductor chip is mounted on a base film such as a TAB (Tape Automated Bonding) tape. The TCP type semiconductor device also includes the so-called COF (Chip On Film).

FIG. 1 is a plan view schematically showing a TCP-type semiconductor device disclosed in Japanese Patent Publication JP-2004-356339. In FIG. 1, a semiconductor chip 120 is mounted on a base film (carrier tape) 110. Moreover, a plurality of leads 130 and a plurality of contact pads 140 are formed on the base film 110. The plurality of leads 130 electrically connect between the semiconductor chip 120 and the plurality of contact pads 140, respectively.

More specifically, as shown in FIG. 1, solder resist SR is so formed as to partially cover each lead 130. The solder resist SR is resin applied on the lead 130 and plays roles of not only electrically isolating the leads 130 but also relaxing chemical stress such as corrosion and physical stress on the leads 130 due to external force. The lead 130 in a region where the solder resist SR is not formed serves as a terminal that is electrically connectable to the outside, and the region is a terminal region. The semiconductor chip 120 is mounted on a central terminal region in which the solder resist SR is not formed, and then it is resin-sealed. On the other hand, an outside terminal region in which the solder resist SR is not formed is an external terminal region and is electrically connected to the contact pads 140.

The contact pads 140 are test terminals used at the time of testing the semiconductor device and are placed within a predetermined region (pad placement region RP) on the base film 110. That is, at the time of testing the semiconductor device, the probes of the probe card come in contact with the contact pads 140 within the pad placement region RP. Then, a test signal is supplied to the semiconductor chip 120 and an output signal is retrieved from the semiconductor chip 120 through the contact pads 140 and the leads 130. It should be noted that the probe card used here also has the probe pattern where positions of the probe ends are distributed over a plurality of rows. Corresponding to the probe pattern, the contact pads 140 also are distributed over a plurality of rows as shown in FIG. 1.

In FIG. 1, a width direction and an extending direction of the base film 110 are x-direction and y-direction, respectively. The structure shown in FIG. 1 is formed repeatedly along the y-direction. On separating the semiconductor chip 120 one by one after the test, the base film 110 and the plurality of leads 130 are cut along a cut line CL indicated by a dashed line in FIG. 1. At this time, the contact pads 140 in the pad placement region RP remain on the base film 110.

As another related technique, a display panel is disclosed in Japanese Patent Publication JP-2008-300297A. The display panel has a panel substrate (front surface substrate) and flexible printed circuits (FPC). A plurality of first electrode terminals are arranged on one end of the panel substrate. The flexible printed circuits have a plurality of second electrode terminals that are respectively connected to the plurality of first electrode terminals. Here, the plurality of first electrode terminals are arranged in a zig-zag manner by being alternately displaced. Moreover, the plurality of second electrode terminals also are arranged in a zig-zag manner by being alternately displaced. Both of the first electrode terminal and the second electrode terminal are formed to be wide; however, the size in the width direction is different between the first electrode terminal and the second electrode terminal.

The inventor of the present application has recognized the following point. In recent years, the number of terminals of the semiconductor chip is increasing, and thus the numbers of test signals supplied to the semiconductor chip and output signals retrieved from the semiconductor chip at the time of the test also are increasing. This means increase in the number of contact pads 140 of the TCP type semiconductor device shown in FIG. 1. The increase in the number of contact pads 140 leads to enlargement of the pad placement region RP and thus to increase in the width and length of the base film 110. As a result, costs of manufacturing the TCP type semiconductor device are increased. Therefore, a technique that can reduce the costs of manufacturing the TCP type semiconductor device is desired.

SUMMARY

In one embodiment of the present invention, a TCP type semiconductor device that is connected to a plurality of substrate-side electrodes parallel to each other and each having a linear shape is provided. The TCP type semiconductor device has: a base film; a semiconductor chip mounted on the base film; and a plurality of leads formed on the base film and electrically connecting between the semiconductor chip and the plurality of substrate-side electrodes, respectively. Each of the plurality of leads has an external terminal section extending in a first direction and configured to come in contact with corresponding one of the plurality of substrate-side electrodes. A part of the external terminal section is a wide section that is formed wider than the other section of the external terminal section. A position of the wide section in the first direction is different between adjacent leads of the plurality of leads.

In another embodiment of the present invention, a TCP type semiconductor device is provided. The TCP type semiconductor device has: a base film having a plurality of device regions each of which is surrounded by a cut line, wherein the base film is cut along the cut line; and a plurality of semiconductor devices placed within the plurality of device regions, respectively. Each of the plurality of semiconductor devices is connected to a plurality of substrate-side electrodes parallel to each other and each having a linear shape. The each semiconductor device has: a semiconductor chip mounted on the base film; and a plurality of leads formed on the base film and electrically connecting between the semiconductor chip and the plurality of substrate-side electrodes, respectively. Each of the plurality of leads has an external terminal section extending in a first direction and configured to come in contact with corresponding one of the plurality of substrate-side electrodes. A part of the external terminal section is a wide section that is formed wider than the other section of the external terminal section. A position of the wide section in the first direction is different between adjacent leads of the plurality of leads.

According to the present invention, the costs of manufacturing the TCP type semiconductor device can be reduced.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 8 is a plan view showing another modification example of the external terminal sections according to the present embodiment.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

1. Configuration

Figure 2:
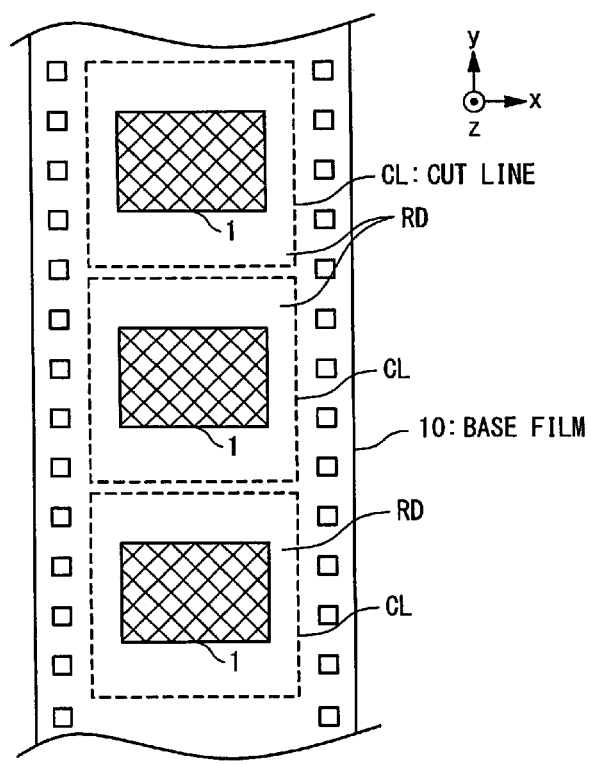
FIG. 2 is a plan view schematically showing a TCP type semiconductor device according to an embodiment of the present invention.

FIG. 2 schematically shows a configuration of a TCP type semiconductor device according to the present embodiment. In the TCP type semiconductor device, a base film (carrier tape) 10 such as a TAB tape is used. As shown in FIG. 2, a width direction and an extending direction of the base film 10 are an x-direction and a y-direction, respectively. The x-direction and the y-direction are planar directions perpendicular to each other.

Figure 1:
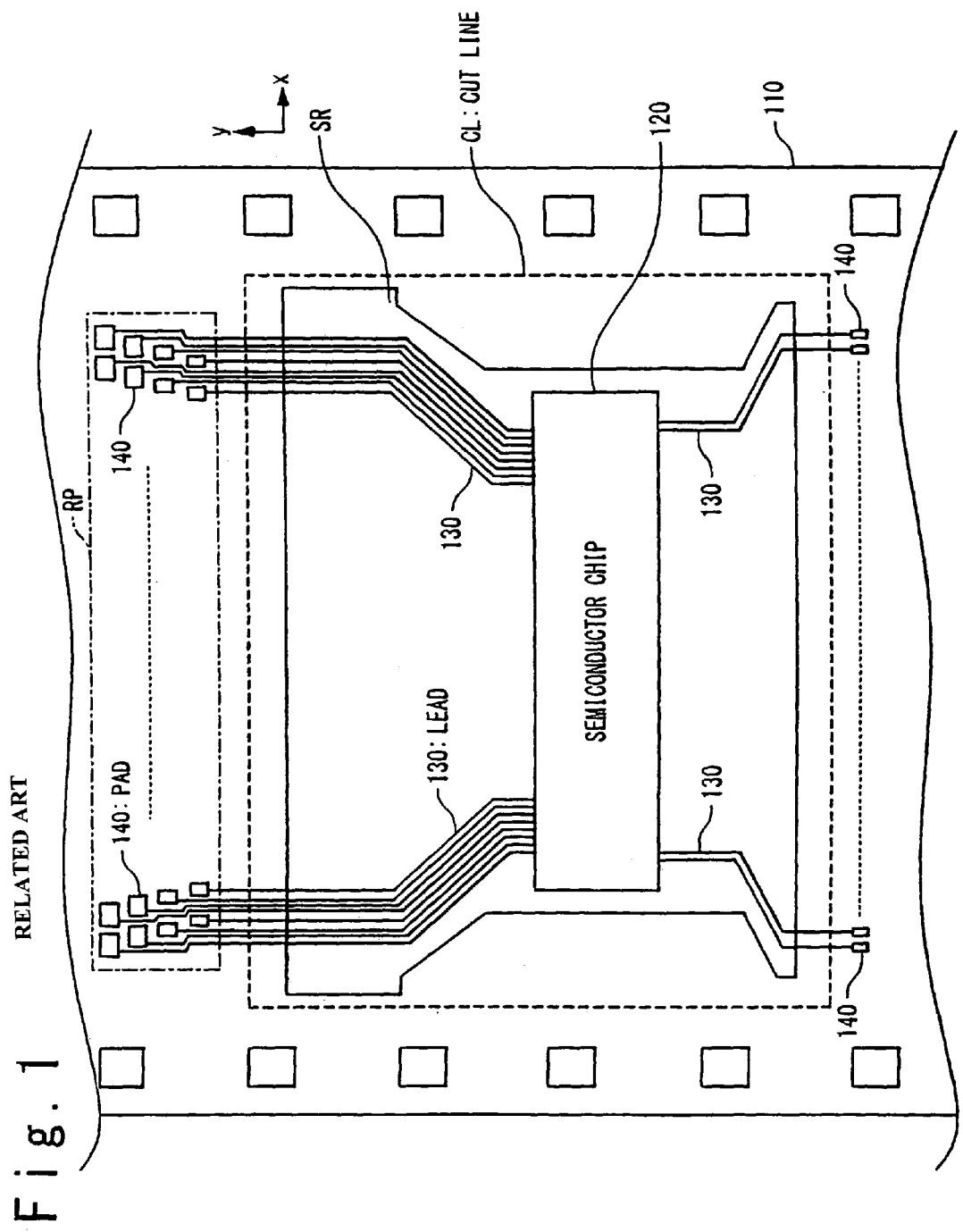
FIG. 1 is a plan view schematically showing a typical TCP type semiconductor device.

A plurality of semiconductor chips 20 are mounted on the base film 10. More specifically, the base film 10 has a plurality of device regions RD that are placed in series along the y-direction. Each of the device regions RD is a region surrounded by a cut line CL on the base film 10. The plurality of semiconductor chips 20 are placed within the plurality of device regions RD, respectively. A single semiconductor device 1 corresponds to the whole within a single device region RD including the semiconductor chip 20. That is, the semiconductor device 1 is placed repeatedly along the y-direction on the base film 10. On separating the semiconductor devices 1 one by one, the base film 10 is cut along the cut line CL. It should be noted in the present embodiment that the pad placement region RP as shown in FIG. 1 is not provided on the base film 10. As shown in FIG. 2, only the device region RD appears repeatedly.

Figure 3:
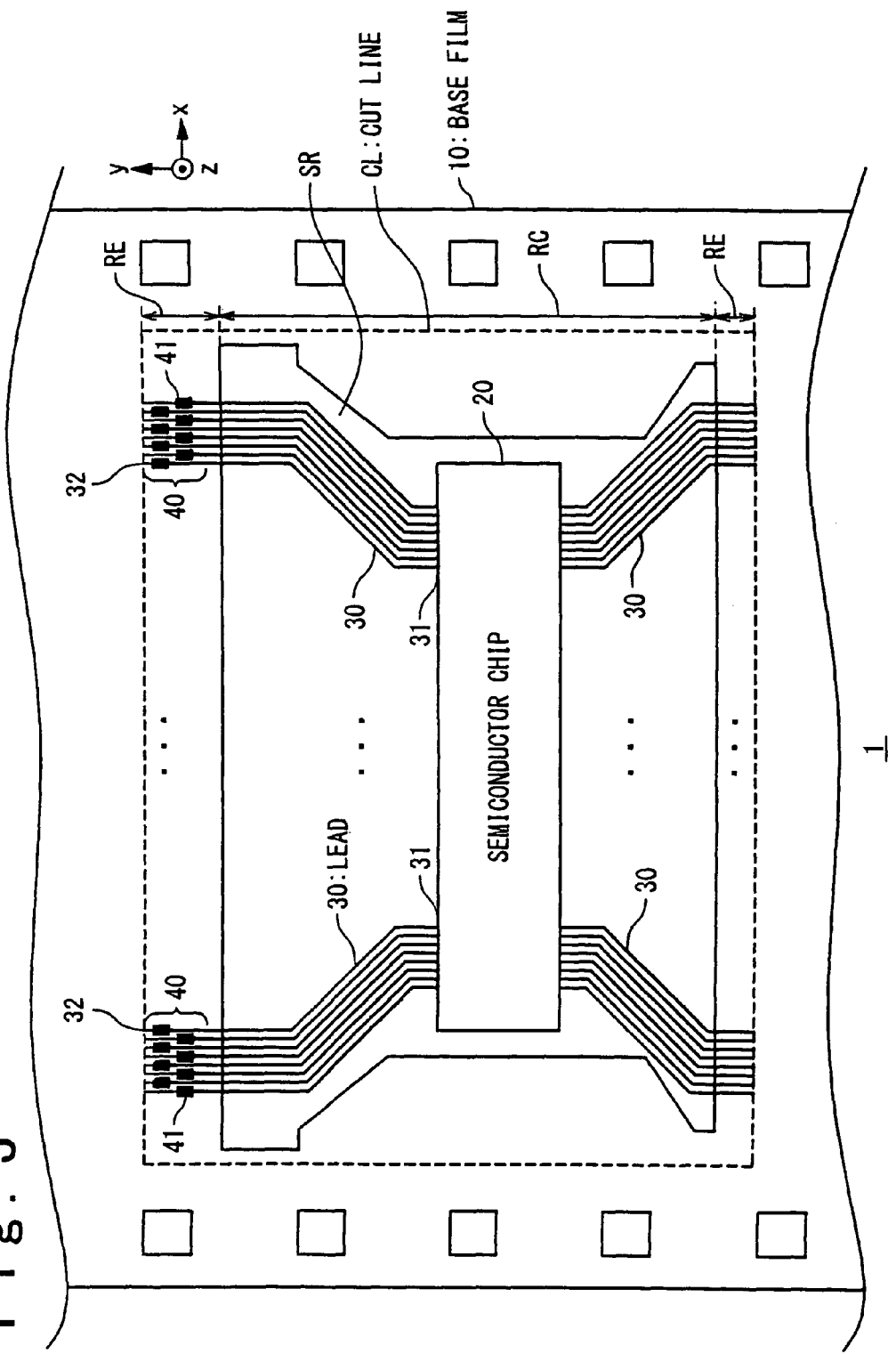
FIG. 3 is a plan view showing the TCP type semiconductor device as one unit according to the present embodiment.

FIG. 3 shows the TCP type semiconductor device as one unit. As shown in FIG. 3, one semiconductor device 1 has the semiconductor chip 20 mounted on the base film 10 and a plurality of leads 30 formed on the base film 10. The plurality of leads 30 are electrically connected to the semiconductor chip 20. More specifically, each of the leads 30 has: a first end section 31; and a second end section 32 located on the opposite side of the first end section 31. The first end section 31 is directly connected to the semiconductor chip 20, while the second end section 32 on the other side is open.

Moreover, solder resist SR is so formed as to partially cover each lead 30. The solder resist SR is resin applied on the lead 30 and plays roles of not only electrically isolating the leads 30 but also relaxing chemical stress such as corrosion and physical stress on the leads 30 due to external force. The lead 30 in a region where the solder resist SR is not formed serves as a terminal that is electrically connectable to the outside. The semiconductor chip 20 is mounted on a central region in which the solder resist SR is not formed, and then it is resin-sealed. A region thus covered by the solder resist SR and the semiconductor chip 20 is hereinafter referred to as a "covered region RC". The lead 30 within the covered region RC is basically covered by the solder resist SR and resin used for sealing after the semiconductor chip 20 is mounted, and is not exposed.

On the other hand, the lead 30 is exposed in a region outside of the covered region RC. The exposed section of the lead 30 is an external terminal section (external connection terminal) 40 used for connection with another device. For example, in a case where the semiconductor chip 20 is an IC for driving a liquid crystal display panel, the external terminal sections 40 are connected to electrodes of the liquid crystal display panel. As a result, the liquid crystal display panel and the semiconductor chip 20 for driving it are electrically connected with each other. It should be noted that this connection process is generally called OLB (Outer Lead Bonding).

The region in which the external terminal sections 40 of the leads 30 are formed is hereinafter referred to as an "external terminal region (OLB region) RE". As shown in FIG. 3, the external terminal sections 40 of the respective leads 30 extend in the y-direction and are parallel to each other in the external terminal region RE. An edge section of each external terminal section 40 is the above-mentioned second end section 32. It should be noted that, among two opposed sides of the external terminal region RE, a side on the side of the semiconductor chip 20 corresponds to one side of the covered region RC, and the opposite side corresponds to one side of the cut line CL. That is, the external terminal region RE do not protrude outward from the cut line CL.

In the present embodiment, the pad placement region RP as shown in FIG. 1 is not provided on the base film 10. That is, the contact pads 140 dedicated to the test as shown in FIG. 1 are not provided and thus the pad placement region RP is excluded from the base film 10. As shown in FIG. 3, the second end section 32 of each lead 30 is not connected to a test-dedicated contact pad and serves as termination of the lead 30. All the leads 30 are formed inside of the cut line CL and do not protrude outward from the cut line CL.

According to the present embodiment, at the time of testing the semiconductor device 1, a special contact pad is not used for contact with a probe. Instead, a part of the external terminal section 40 within the external terminal region RE is used for contact with a probe. This section used for the contact with the probe is hereinafter referred to as a "test pad section 41". That is, the external terminal section 40 of each lead 30 is not only used for connection with another device but also provided with the test pad section 41 that comes in contact with the probe at the time of testing the semiconductor device 1.

Figure 4:
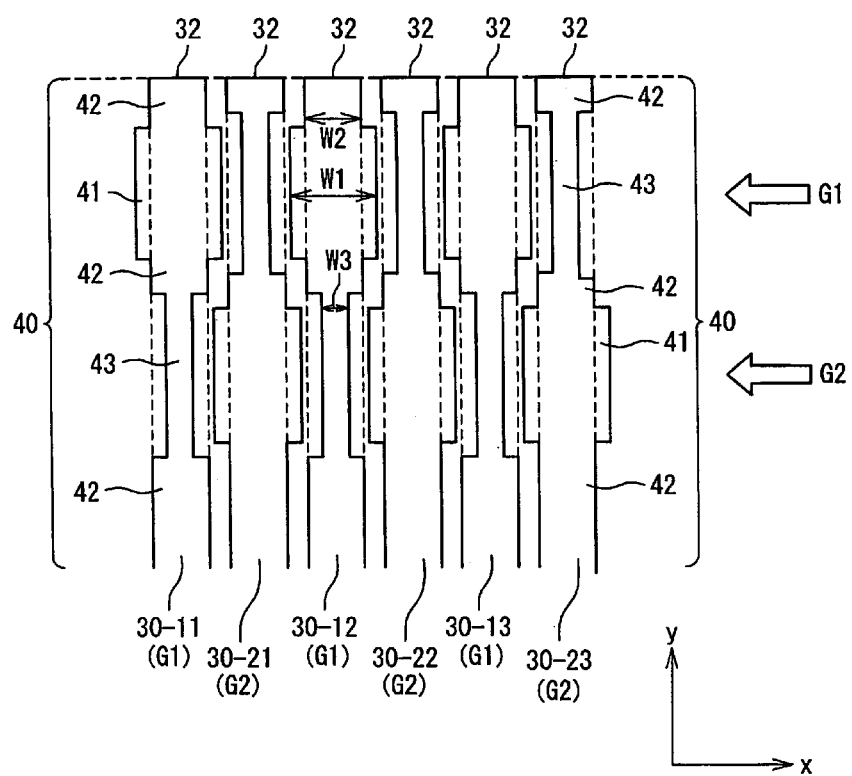
FIG. 4 is a plan view showing a configuration example of external terminal sections according to the present embodiment.

FIG. 4 shows a configuration example of the external terminal sections 40 according to the present embodiment. In the external terminal region RE, the external terminal sections 40 are parallel to each other and extend in the y-direction. Here, a width direction is defined as the x-direction orthogonal to the extending direction. In this case, as shown in FIG. 4, the test pad section 41 is so formed as to be wider than the other section of the external terminal section. That is, a width W1 of the test pad section (wide section) is larger than a width W2 of a normal section 42 (W1>W2). This makes it easier to bring the tip end (needlepoint) of the probe into contact with the test pad section 41 at the time of test.

Moreover, the position of the test pad section 41 in the y-direction is different between adjacent leads 30. That is, the respective positions of the test pad sections 41 of the adjacent leads 30 are away from each other in the y-direction. For example, in FIG. 4, the y-direction position of the test pad section 41 of a lead 30-11 is different from the y-direction position of the test pad section 41 of an adjacent lead 30-21. Also for example, the y-direction position of the test pad section 41 of the lead 30-21 is different from the y-direction position of the test pad section 41 of an adjacent lead 30-12. The same applies to the other leads 30.

In this manner, according to the present embodiment, the wide test pad sections 41 are so arranged as not to be too close to each other. As a result of such the arrangement, the adjacent leads 30 can be placed more closely to each other without causing short between probes connected to the respective test pad sections 41 of the adjacent leads 30. That is, a pitch between the adjacent leads 30 can be designed smaller. In particular, it is preferable that the respective test pad sections 41 of the adjacent leads 30 are so formed as to partially overlap in the y-direction with each other as shown in FIG. 4. In this case, the test pad sections 41 are arranged in a very efficient manner, the pitch between the adjacent leads 30 can be made smaller, and an area of the base film 10 required for the arrangement of the leads 30 is reduced. This is preferable in terms of miniaturization of the semiconductor device and increase in the number of terminals in recent years.

Furthermore, it is preferable that the respective test pad sections 41 of the plurality of leads 30 are distributed over a plurality of rows in the external terminal region RE. In FIG. 4, for example, the test pad sections 41 are divided into two rows and arranged in a zig-zag manner. More specifically, the plurality of leads 30 are grouped into two groups G1 and G2. The first group G1 includes the leads 30-1$i$, and the second group G2 includes the leads 30-2$i$ (i=1, 2, 3 . . . ). The respective test pad sections 41 of the leads 30-1$i$ of the first group G1 are aligned in the x-direction and arranged in the same row. Also, the respective test pad sections 41 of the leads 30-2$i$ of the second group G2 are aligned in the x-direction and arranged in a different row from the first group G1. The leads 30-1$i$ of the first group G1 and the leads 30-2$i$ of the second group G2 are alternately placed. In this manner, the test pad sections 41 are arranged in a regular manner. This makes it easier to bring the respective probes into one-on-one contact with the corresponding test pad sections 41 at the time of test.

Moreover, each external terminal section 40 may has a narrow section 43 that is narrower than the other section, as shown in FIG. 4. A width W3 of the narrow section 43 is smaller than the width W2 of the normal section 42 (W3<W2). In the example shown in FIG. 4, the narrow section 43 is equivalent to a structure obtained by forming "cutouts" on both sides of the normal section 42. The narrow section 43 is so provided as to face the wide test pad section 41 of the adjacent lead 30. That is to say, the test pad section 41 of a certain lead 30 and the narrow section 43 of the adjacent lead 30 face each other. By providing the narrow sections 43 in this manner, space is ensured around the wide test pad section 41. As a result, at the time of test, a needle-point of one probe is prevented from simultaneously coming in contact with two adjacent leads 30. In other words, occurrence of a short failure between the leads 30 is prevented at the time of test.

Furthermore, it is preferable that all the leads 30 have the same length in the external terminal region RE, as shown in FIGS. 3 and 4. In other words, it is preferable that the length of the external terminal section 40 is the same between all the leads 30. The respective external terminal sections 40 extend to the same y-direction position inside of the cut line CL, and locations of the respective second end sections 32 (edge sections) are aligned in the x-direction. In the case where the edge sections of the all leads 30 are aligned in this manner, the manufacturing process becomes easier, which is preferable.

2. Test and Implementation 2-1. Test

According to the present embodiment, at the time of testing the semiconductor device 1, a special contact pad is not used for contact with the probe. Instead, a part of the external terminal section 40 is so formed to be wide, and the wide section is used as the test pad section 41 that comes in contact with the probe. Therefore, the contact pads 140 dedicated to test as shown in FIG. 1 are not provided, and the pad placement region RP is excluded from on the base film 10. As a result, a region on the base film 10 required for one semiconductor chip 20 can be greatly reduced as compared with the case of FIG. 1. It is therefore possible to reduce material cost and also to improve efficiency of placing the semiconductor chips 20 on the base film 10. It is thus possible to reduce the costs of manufacturing the semiconductor device 1.

Figure 5:
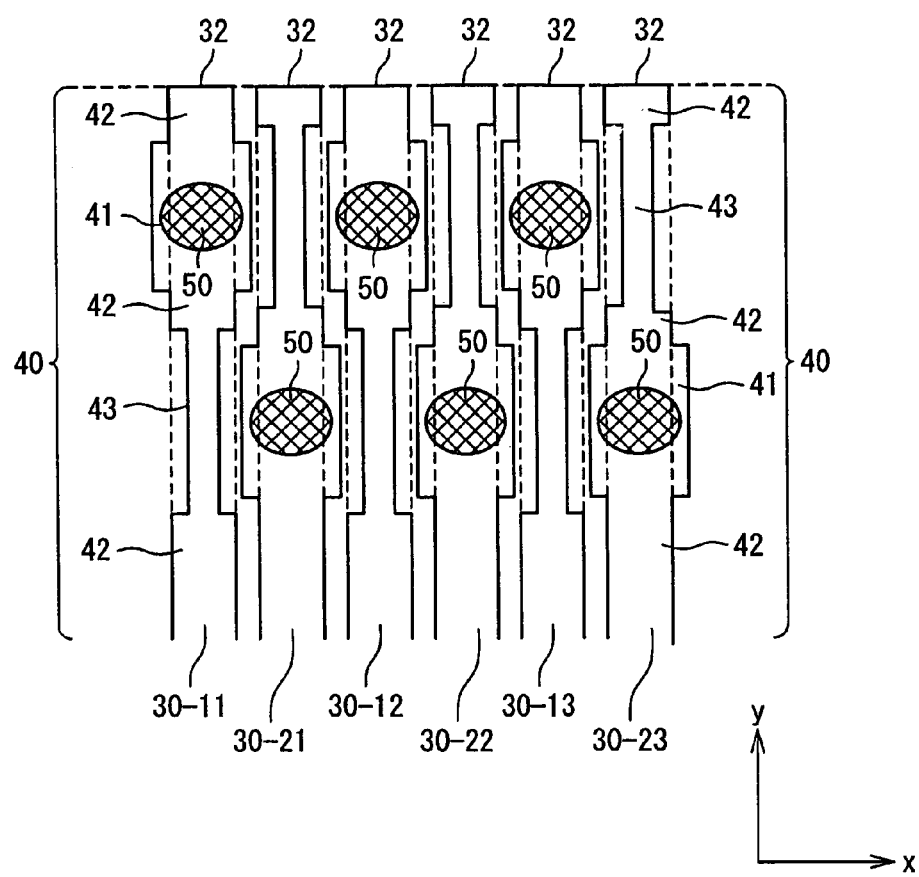
FIG. 5 is a plan view showing connection between probes and the external terminal sections according to the present embodiment.

FIG. 5 shows connection between the external terminal sections 40 and probes 50 at the time of testing the semiconductor device 1. As shown in FIG. 5, at the time of test, the probe 50 comes in contact with the test pad section 41 being a part of the external terminal section 40. The test pad section 41 is formed to be wide, which makes it easier to bring the tip end (needlepoint) of the probe 50 into contact with the test pad section 41.

Moreover, the position of the test pad section 41 in the y-direction is different between adjacent leads 30. Therefore, the probes 50 connected to the respective test pad sections 41 of the adjacent leads 30 are prevented from short-circuit. Furthermore, the narrow section 43 is so provided as to face the test pad section 41, and thus space is ensured around the wide test pad section 41. Therefore, one probe 50 is prevented from simultaneously coming in contact with two adjacent leads 30, even if the probe position is slightly displaced. Conversely, permissible amount of the displacement of the probe 50 becomes larger.

2-2. Cutting

On separating the TCP type semiconductor device 1 one by one, the base film 10 is cut along the cut line CL (see FIGS. 2 and 3). At this time, short failure caused by metal burr can be suppressed according to the present embodiment.

As a comparative example, let us consider the case shown in FIG. 1. In the comparative example, the semiconductor chip 120 is connected to the test contact pads 140 through the leads 130. Therefore, on separating the semiconductor devices one by one, it is necessary to cut the leads 130 along the cut line CL. The metal burr generated at this time can cause the short failure later. According to the present embodiment, on the other hand, the test contact pads 140 are not provided. As shown in FIG. 3, the leads 30 are formed only within the device region RD surrounded by the cut line CL. Therefore, on separating the semiconductor devices 1 one by one, cutting of the leads 30 is not performed. As a result, the short failure caused by the metal burr can be suppressed. In addition, a jig used for separating the semiconductor device 1 one by one need not cut the metal lead 30, and thus the jig life is increased.

2-3. Implementation

The semiconductor chip 20 according to the present embodiment is an IC for driving a display panel such as a liquid crystal display panel and a plasma display panel. The semiconductor chip 20 is electrically connected to electrodes of the display panel through the leads 30. More specifically, the display panel has: a plurality of pixels formed in a matrix form on a substrate; and a plurality of electrodes (data lines and the like) formed on the substrate for driving the pixels. The respective electrodes are electrically connected to the plurality of leads 30 of the TCP type semiconductor device 1 (package) according to the present embodiment. The electrode connected to the lead 30 in this manner is hereinafter referred to as a "substrate-side electrode 60".

Figure 6:
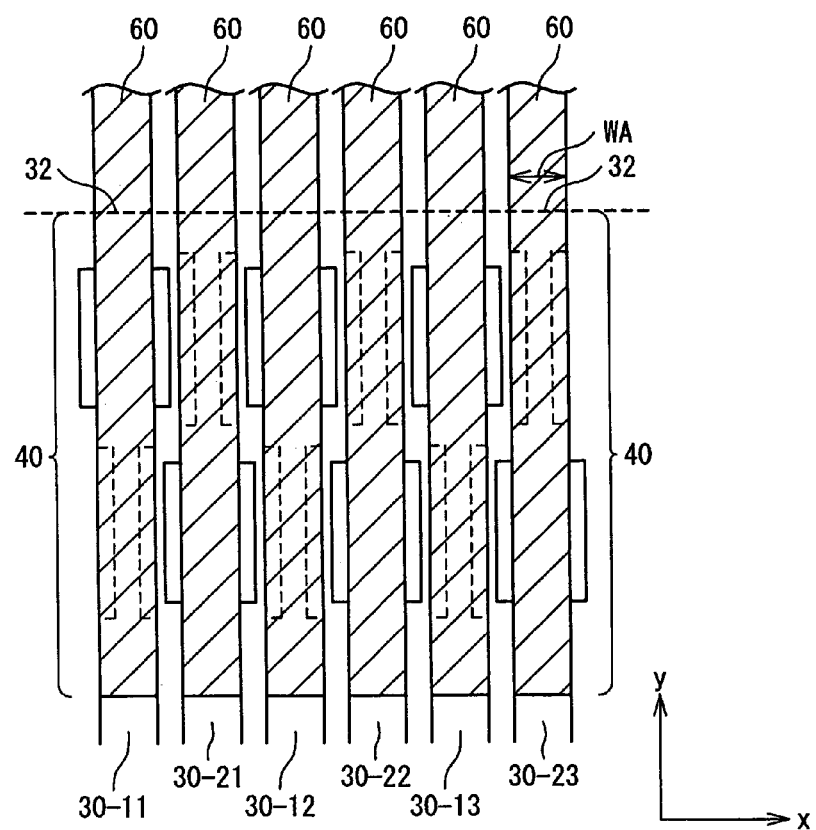
FIG. 6 is a plan view showing connection between substrate-side electrodes and the external terminal sections according to the present embodiment.

FIG. 6 shows connection between the plurality of leads 30 and the plurality of substrate-side electrodes 60. The substrate-side electrodes 60 are hatched. Typically, the plurality of substrate-side electrodes 60 are parallel to each other and each substrate-side electrode 60 is a straight electrode having a linear shape, as shown in FIG. 6. In other words, each substrate-side electrode 60 has no wide section formed to be wider than the other section. End sections of the plurality of substrate-side electrodes 60 are respectively in contact with the external terminal sections 40 of the plurality of leads 30. That is, an external terminal section 40 extending in the y-direction is in contact with a corresponding one linear-shaped substrate-side electrode 60.

As shown in FIG. 6, a substrate-side electrode 60 being in contact with an external terminal section 40 should be separated from the wide test pad section 41 of the adjacent external terminal section 40. From this point of view, it is desirable that a width WA of one substrate-side electrode 60 is equal to or smaller than the width W2 of the normal section 42 of the external terminal section 40. To put it the other way around, it is preferable that the width W2 of the normal section 42 is designed to be equal to or larger than the width WA of the substrate-side electrode 60. In terms of a contact area between the external terminal section 40 and the substrate-side electrode 60, it is preferable that the width WA and the width W2 are the same.

In terms of a contact area between the external terminal section 40 and the substrate-side electrode 60, it is also preferable that the length of the external terminal section 40 is the same between all the leads 30 (see FIGS. 3 and 4). As shown in FIGS. 3 and 4, the positions of the second end sections 32 (edge sections) of the all leads 30 agree and are aligned in the x-direction. For example, in FIG. 4, the lead 30-2$i$ of the second group G2 never ends up at the test pad section 41. In this case, the contact area between the external terminal section 40 and the substrate-side electrode 60 becomes uniform, which is preferable.

According to the technique described in the above-mentioned Japanese Patent Publication JP-2008-300297A, a display panel has a panel substrate (front surface substrate) and flexible printed circuits (FPC). A plurality of first electrode terminals are arranged on one end of the panel substrate. The flexible printed circuits have a plurality of second electrode terminals that are respectively connected to the plurality of first electrode terminals. Here, the plurality of first electrode terminals are arranged in a zig-zag manner by being alternately displaced. Moreover, the plurality of second electrode terminals also are arranged in a zig-zag manner by being alternately displaced. Both of the first electrode terminal and the second electrode terminal are formed to be wide; however, the size in the width direction is different between the first electrode terminal and the second electrode terminal. In this manner, a special shape is required for the first electrode terminal on the panel substrate.

On the other hand, according to the present embodiment, there is no need to employ a special shape as a shape of the substrate-side electrode 60 of the display panel. The shape of the substrate-side electrode 60 just needs to be a typical one (linear shape), and there is no need to make a special shape in accordance with the shape of the external terminal section 40 on the package side. That is to say, the TCP type semiconductor device 1 (IC package) according to the present embodiment supports a commonly-used display panel, and thus there is no need to change design of the display panel. Since makers of a display panel and an IC package are, in many cases, different in a field of the display device, the present invention is particularly useful.

3. MODIFICATION EXAMPLE

Figure 7:
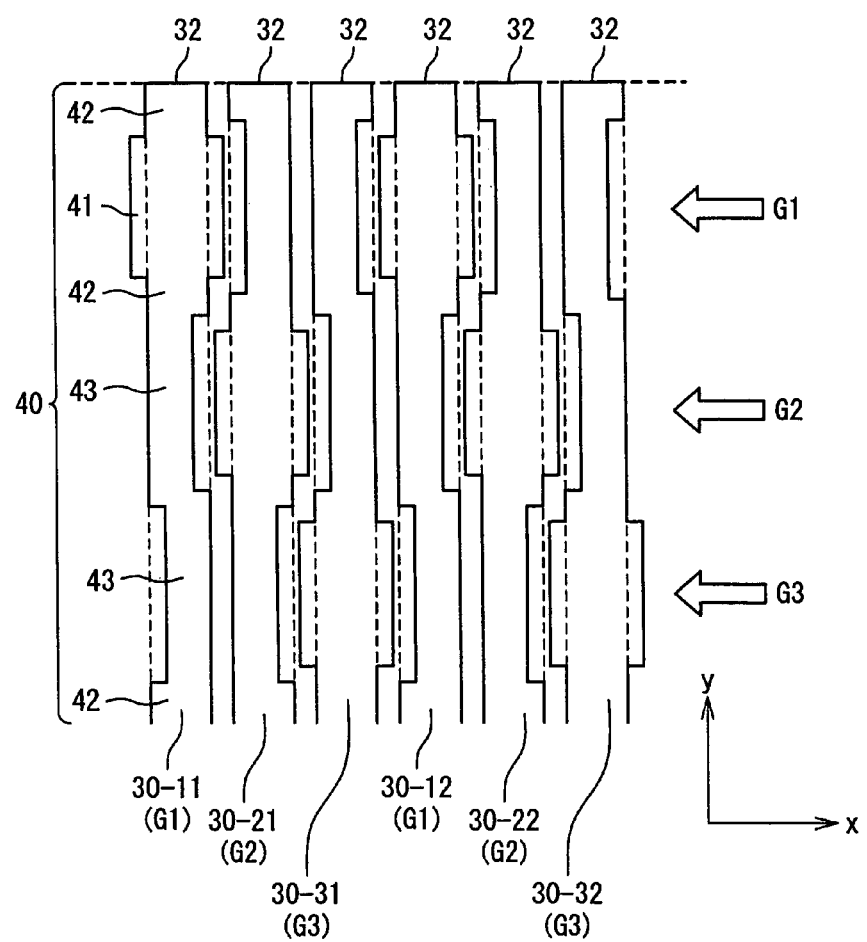
FIG. 7 is a plan view showing a modification example of the external terminal sections according to the present embodiment.

In the example shown in the foregoing FIG. 4, the test pad sections 41 are distributed over two rows. The number of rows can be three or more. In FIG. 7, for example, the test pad sections 41 are distributed over three rows. In this case, the plurality of leads 30 are grouped into three groups G1 to G3. The first group G1 includes the leads 30-1$i$, the second group G2 includes the leads 30-2$i$, and the third group G3 includes the leads 30-3$i$ ($i$=1, 2 . . . ). In the case of FIG. 7, it is enough to make the "cutout" on only one side of the narrow section 43 so as to face the test pad section 41. As a result, the width W3 of the narrow section 43 is larger than that in the case shown in FIG. 4.

A planar shape of the test pad section 41 is not limited to rectangle as shown in FIG. 4. The test pad section 41 just needs to be formed wider than the other section of the external terminal section 40. For example, the planar shape of the test pad section 41 may be a rectangle with round corners. The planar shape of the test pad section 41 may be oval or a tear-drop shape. Moreover, as shown in FIG. 8, the test pad section 41 and the narrow section 43 may be formed to have a "corrugated shape". In either case, the same effects as described above can be obtained.

It is apparent that the present invention is not limited to the above embodiments and may be modified and changed without departing from the scope and spirit of the invention.

What is claimed is:

1. A tape carrier package (TCP) type semiconductor device connected to a plurality of substrate-side electrodes parallel to each other and each having a linear shape, the TCP type semiconductor device comprising:
   a base film;
   a semiconductor chip mounted on said base film; and
   a plurality of leads formed on said base film, each lead of the plurality of leads comprising a first end and a second end, the first end electrically connecting to said semiconductor chip and the second end electrically connecting to a corresponding one of said plurality of substrate-side electrodes, respectively,
   wherein each of said plurality of leads includes an external terminal section extending in a first direction and configured to come in contact with a corresponding one of said plurality of substrate-side electrodes,
   wherein a part of said external terminal section of each lead of the plurality of leads comprises a wide section that is formed wider than an other section of said external terminal section, and
   wherein a position of said wide section in said first direction is different between adjacent leads of said plurality of leads.

2. The TCP type semiconductor device according to claim 1, wherein said external terminal section of each lead of said plurality of leads comprises a same length.

3. The TCP type semiconductor device according to claim 1, wherein a planar direction parallel to said base film and perpendicular to said first direction comprises a second direction, and
   respective edge locations of said external terminal section of each lead of said plurality of leads are aligned in said second direction.

4. The TCP type semiconductor device according to claim 1, wherein said adjacent leads comprise a first lead and a second lead, and
   said wide section of said first lead and said wide section of said second lead partially overlap in said first direction with each other.

5. The TCP type semiconductor device according to claim 1, wherein said adjacent leads comprise a first lead and a second lead,
   wherein said external terminal section of each of the first and second lead further comprises:
      a normal section comprising a width that is smaller than a width of said wide section; and
      a narrow section comprising a width that is smaller than a width of said normal section, and
   wherein said wide section of said first lead and said narrow section of said second lead face each other.

6. The TCP type semiconductor device according to claim 1, wherein a planar direction parallel to said base film and perpendicular to said first direction comprises a second direction,
   wherein said plurality of leads are grouped into at least two groups, and
   wherein in each of said at least two groups, said wide section is aligned in said second direction.

7. The TCP type semiconductor device according to claim 1, wherein said wide section comprises a test pad section that is configured to come in contact with a probe at a time of test.

8. The TCP type semiconductor device according to claim 1, wherein each substrate-side electrode of the plurality of substrate side electrodes comprises approximately a same width.

9. The TCP type semiconductor device according to claim 1, wherein, at a position where the external terminal section of each lead of the plurality of leads is configured to come in contact with the corresponding one of the plurality of substrate-side electrodes, the external terminal section of each lead comprises substantially a same width.

10. The TCP type semiconductor device according to claim 1, wherein the external terminal section of each lead of the plurality of leads further comprises:
    a normal section comprising a width that is less than a width of the wide section; and
    a narrow section comprising a width that is less than a width of the normal section, and
    wherein, at a position where the external terminal section of each lead of the plurality of leads is configured to come in contact with the corresponding one of the plurality of substrate-side electrodes, the external terminal section of each lead comprises the normal width.

11. The TCP type semiconductor device according to claim 1, wherein the plurality of leads comprises a first lead, a second lead and a third lead, and
    wherein the external terminal section of each of the first, second and third leads comprises:
       a normal section comprising a width that is less than a width of the wide section; and
       a narrow section comprising a width that is less than a width of the normal section.

12. The TCP type semiconductor device according to claim 5, wherein said width of said normal section is greater than or equal to a width of said each substrate-side electrode.

13. The TCP type semiconductor device according to claim 5, wherein the width of the normal section is equal to a width of each substrate-side electrode of the plurality of substrate-side electrodes.

14. The TCP type semiconductor device according to claim 5, wherein the narrow section comprises a corrugated shape.

15. The TCP type semiconductor device according to claim 10, wherein the corresponding one of the plurality of substrate side electrodes comprises a width that is less than or equal to the width of the normal section.

16. The TCP type semiconductor device according to claim 11, wherein the first lead is adjacent to a first side of the second lead and the third lead is adjacent on a second side of the second lead, and
    wherein the wide section of the second lead faces the narrow section each of the first and third lead.

17. The TCP type semiconductor device according to claim 16, wherein the plurality of leads further comprises a fourth lead that is adjacent to the third lead, the fourth lead comprising a same configuration of narrow, normal and wide sections as the first lead, and wherein the narrow section of each of the third and fourth lead face each other.

18. A tape carrier package (TCP) type semiconductor device comprising:
a base film having a plurality of device regions each of which is surrounded by a cut line, wherein said base film is cut along said cut line; and
a plurality of semiconductor devices placed within said plurality of device regions, respectively,
wherein each of said plurality of semiconductor devices is connected to a plurality of substrate-side electrodes parallel to each other and each having a linear shape,
wherein said each semiconductor device comprises:
a semiconductor chip mounted on said base film; and
a plurality of leads formed on said base film, each lead of the plurality of leads comprising a first end and a second end, the first end electrically connecting to said semiconductor chip and the second end electrically connecting to a corresponding one of said plurality of substrate-side electrodes, respectively,
wherein each of said plurality of leads includes an external terminal section extending in a first direction and configured to come in contact with a corresponding one of said plurality of substrate-side electrodes,
wherein a part of said external terminal section of each lead of the plurality of leads comprises a wide section that is formed wider than an other section of said external terminal section, and
wherein a position of said wide section in said first direction is different between adjacent leads of said plurality of leads.

* * * * *